United States Patent [19]

Hara et al.

[11] Patent Number: 4,695,750
[45] Date of Patent: Sep. 22, 1987

[54] VOLTAGE LEVEL CONVERTING CIRCUIT

[75] Inventors: Hiroyuki Hara, Tokyo; Michinori Nakamura; Yasuhiro Sugimoto, both of Yokohama, all of Japan

[73] Assignee: Kabushiki Kaisha Toshiba, Asaki, Japan

[21] Appl. No.: 770,090

[22] Filed: Aug. 28, 1985

[30] Foreign Application Priority Data

Aug. 29, 1984 [JP] Japan ................... 59-179644

[51] Int. Cl.[4] ............... H03K 19/092; H03K 19/086; H03K 19/003; H03K 17/10
[52] U.S. Cl. ...................... 307/475; 330/257; 330/300; 307/446; 307/570; 307/264; 323/316
[58] Field of Search ............ 307/475, 264, 446, 570; 323/312, 315, 316, 317; 330/257, 300

[56] References Cited

U.S. PATENT DOCUMENTS

| 3,644,838 | 2/1972 | Graf | 330/300 X |
| 4,152,663 | 5/1979 | Van de Sande | 330/257 X |
| 4,335,355 | 6/1982 | Haque | 330/300 X |
| 4,371,843 | 1/1983 | Fang et al. | 330/257 X |
| 4,449,067 | 5/1984 | Nishikawa | 307/570 |
| 4,593,208 | 6/1986 | Single | 323/316 X |

OTHER PUBLICATIONS

DesCamps et al., "Consumer Circuits", IEEE International Solid State Circuits Conference, pp. 27-29, Feb. 18, 1981.

Primary Examiner—Stanley D. Miller
Assistant Examiner—David R. Bertelson
Attorney, Agent, or Firm—Finnegan, Henderson, Farabow, Garrett and Dunner

[57] ABSTRACT

A voltage level converting circuit includes first and second potential terminals between which a power source voltage is applied, first and second terminals for receiving an input signal and an inverted input signal, a differential amplifier including npn transistors whose conduction states are controlled by the input signal and the inverted input signal, and an output circuit for generating an output logic signal corresponding to the output voltage of the differential amplifier. The output circuit of this voltage level converting circuit has a current path connected in series between the first and second potential terminals by way of a constant current source, and includes a MOS transistor whose conduction state is controlled by the output voltage of the differential amplifier.

5 Claims, 5 Drawing Figures

VOLTAGE LEVEL CONVERTING CIRCUIT

BACKGROUND OF THE INVENTION

This invention relates to a voltage level converting circuit and, more particularly, to a voltage level converting circuit as an input interface to a logic device.

To operate a TTL (transistor transistor logic) device in response to the output signal of an ECL (emitter coupled logic) device, a voltage level converting circuit is provided at the prestage of the TTL device. The reason for this is that the amplitude of the output signal of the ECL device is relatively small and varies in a voltage range which is unacceptable for the input signal variation range of the TTL device.

FIG. 1 shows a voltage level converting circuit of prior art. As shown, this circuit has npn transistors 11 and 12 as a differential pair. The bases of the transistors 11 and 12 are connected to input terminals 13A and 13B, respectively. The input terminal 13A receives the output signal of an ECL circuit, for example, while the input terminal 13B receives the inverted one. The collector of the transistor 12 is connected to a first potential terminal 17 through series connected resistors 14 to 16. The emitter of the transistor 12 is connected to the emitter of the transistor 11 and, through a resistor 18, to a second potential terminal 19. The collector of the transistor 11 is connected to the emiter of an npn transistor 20. The collector of the transistor 11 is connected to the first potential terminal 17. The base of the transistor 20 is connected to the base of an npn transistor 21. The base of the transistor 21 is connected to its collector which, in turn, is connected to the first potential terminal 17 by way of a resistor 22. The emitter of the transistor 21 is connected to the collector of the transistor 12 and a ground potential terminal 23. The emitter of the transistor 20 is connected to the junction between the resistors 14 and 15 and the base of an npn transistor 24. The collector of the transistor 24 is connected to an output terminal 25, and the emitter thereof to the ground potential terminal 23. The base and the collector of the npn transistor 24 are coupled with the junction between the resistors 15 and 16. The emitter of the transistor 24 is connected to the output terminal 25. A resistor 26, formed, for example, in a TTL device, is connected between the first potential terminal 17 and the output terminal 25.

In the voltage level converting circuit thus aranged, a potential difference between the input terminals 13A and 13B selectively renders either of the transistors 11 and 12 conductive. When, for example, the output signal of the ECL device is of a high voltage level, the transistors 11 and 12 are turned on and off, respectively. Then, the junction between the resistors 14 and 15 is set at 0 V (i.e., ground level), thereby off the transistor 24. The potential of 0 V is determined in the following manner. Assuming that the voltage drop across the base-emitter path of each of the transistors 20 and 21 is $V_{BE}$, the base potential of transistor 20 is always higher by $V_{BE}$ than the emitter potential of the transistor 21. When the transistor 11 is conductive, the emitter current of the transistor 20 flows into the transistor 11, not the resistor 14; the emitter potential of the transistor 20 is set to be $V_{BE}$ lower than its base potential. Thus, the emitter potential of the transistor 20 is set at the ground level, equal to the emitter potential of the transistor 21.

When the output signal of the ECL device is of a low voltage level, the transistors 12 and 11 are turned on and off, respectively. The current from the resistor 15 and the emitter current from the transistor 20 is supplied to the resistor 14. The transistor 24 is turned on by the voltage drop across the resistor 14.

The voltage level converting circuit described above can convert the voltage signal within the ECL range into that within the TTL range. This circuit, however, requires two power sources corresponding to the first and second potential terminals 17 and 19, as well as many further circuit elements, particularly bipolar transistors.

FIG. 2 shows a response characteristic of this voltage level converting circuit. This characteristic was ploted as the result of the SPICE simulation. In this simulation, the collector currents of the transistors 11 and 12 in the conductive state was set at 500 $\mu$A, and the collector current of the transistor 24 in the conductive state was 400 $\mu$A. As seen from FIG. 2, the output signal of the voltage level converting circuit takes a relatively long time to reach a predetermined level. In order that this converting circuit responds to a logic signal of about 10 MHz at a satisfactorily high speed, the collector current of the transistor 24 must be set to at least 1 mA. Under these circumstances, however, the conveting circuit dissipates much power.

FIG. 3 shows another voltage level converting circuit of prior art. As shown, this voltage level converting circuit comprises, at its input stage, a differential pair of pnp transistors 30 and 31, as well as, at the output stage, both an npn transistor 32 and a pnp transistor 33. A first potential terminal 28 is connected to the emitters of the transistors 30 and 31 by way of a resistor 35 . A second potential terminal 29 is connected through a resistor 36 to the collector of the transistor 30, and directly connected to the collector of the transistor 31. The collector of the transistor 30 is connected to the base of the transistor 32. The conduction state of the transistor 32 is under control of the voltage drop across the resistor 36. The transistor 32 is connected at the emitter to the second potential terminal 29, and at the collector to the output terminal 39. The first potential terminal 28 is connected to the collector of the transistor 32 through a resistor 38 and the current path of a transistor 33. The transistor 33, supplied at the base with a bias voltage VB, prevents the transistor 32 from operating in the saturation region.

In operation, when a high level voltage is applied as an input signal to the first input signal 34A, and a low level voltage is applied as an inverted input signal to the second input terminal 34B, the transistor 30 is turned off and the transistor 31 is turned on. Under this condition, the base of the transistor 32 is at substantially the same potential as that the terminal 29, so that the transistor 32 is turned off. At this time, the potential at the output terminal 39 is substantially equal to the high level potential at the first terminal 28. When a low level voltage is applied as an input signal to the first input terminal 34A, and a high level voltage is applied as an inverted input signal to the second input terminal 34B, the transistor 30 is turned on and the transistor 31 is turned off. Under this condition, current flows from the terminal 28 into the resistor 36 through the resistor 35 and the emitter-collector path of the transistor 30. This current causes a voltage drop across the resistor 36. The voltage drop biases the transistor 32 appropriately, turning it on. When the transistor 32 is turned on, the terminal 39 is grounded through the transistor 32. Accordingly, the potential at the terminal 39 is substantially equal to the ground potential, i.e., the potential at the terminal 29.

This voltage level converting circuit employs a single power source for converting the input voltage within the ECL range into the output voltage within the TTL range. In this converting circuit the pnp transistor 33 is connected, in cascade fashion, to the npn transistor 32 in order to prevent the transistor 32 from operating in the saturation region. Such a connection is unpreferable because the pnp transistor is not capable of high speed performance. Therefore, the operating speed of this prior converting circuit is slow. Additionally, this converting circuit, as in the prior converting circuit of FIG. 1, consumes much power.

SUMMARY OF THE INVENTION

Accordingly, an object of the present invention is to provide a voltage level converting circuit which is operable at a high speed and with little power dissipation.

According to the present invention, there is provided a voltage level converting circuit comprising first and second potential terminals, to which a power source voltage is applied; a differential amplifier containing first and second bipolar transistors of which the conduction states are controlled by voltage levels of an input signal and an inverted input signal, the differential amplifier being connected between the first and second potential terminals in order to produce an output voltage corresponding to a conduction state of the first bipolar transistor; and an output circuit having a MOS transistor of which the conduction state is controlled by the output voltage of the differential amplifier and a constant current source, the current path of the MOS transistor being connected in series to the constant current source between the first and second potential terminals.

According to this invention, a bipolar transistor is used in the differential amplifier and a MOS transistor is used in the output circuit. The differential amplifier can reliably detect a slight change in the voltage of the input signal, while the MOS transistor of the output circuit can, unlike the bipolar transistor, control a large voltage in an unsaturated region. This level converting circuit does not require a large number of circuit elements to obtain a high operation speed, and consumes a reduced amount of power.

DETAILED DESCRIPTION OF THE PREFERRED EMBODIMENT

Figure 1:
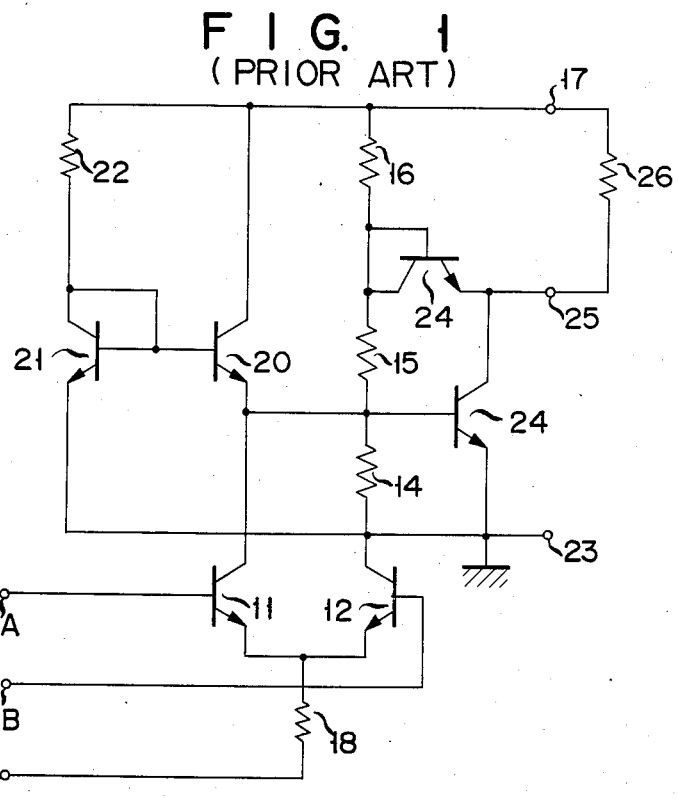
FIG. 1 is a circuit diagram of a prior voltage level converting circuit.
Figure 2:
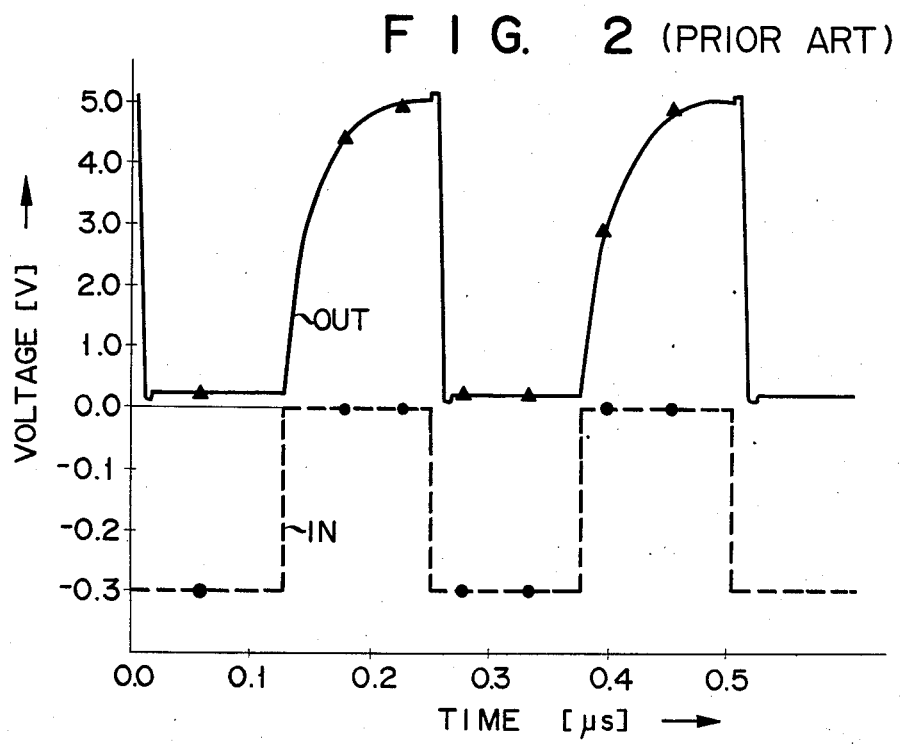
FIG. 2 is a graph illustrating a response characteristic of the level converting circuit of FIG. 1.
Figure 3:
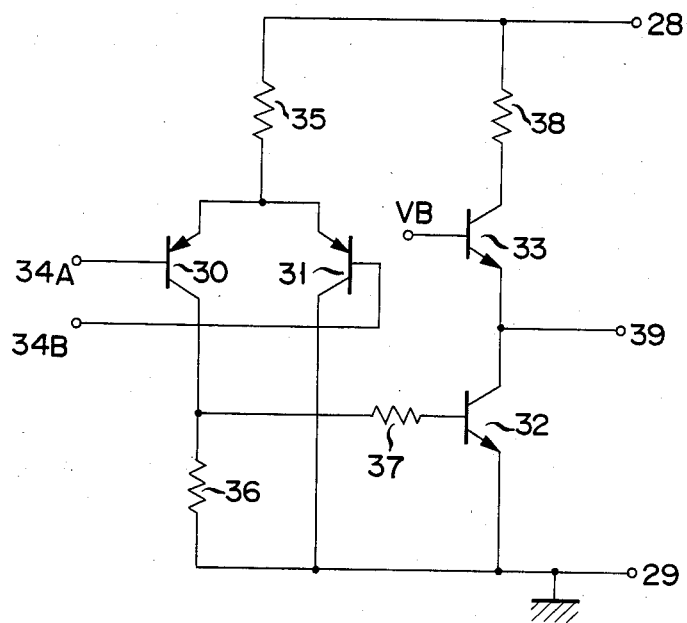
FIG. 3 is a circuit diagram of another prior voltage level converting circuit which operates on a single power source.
Figure 4:
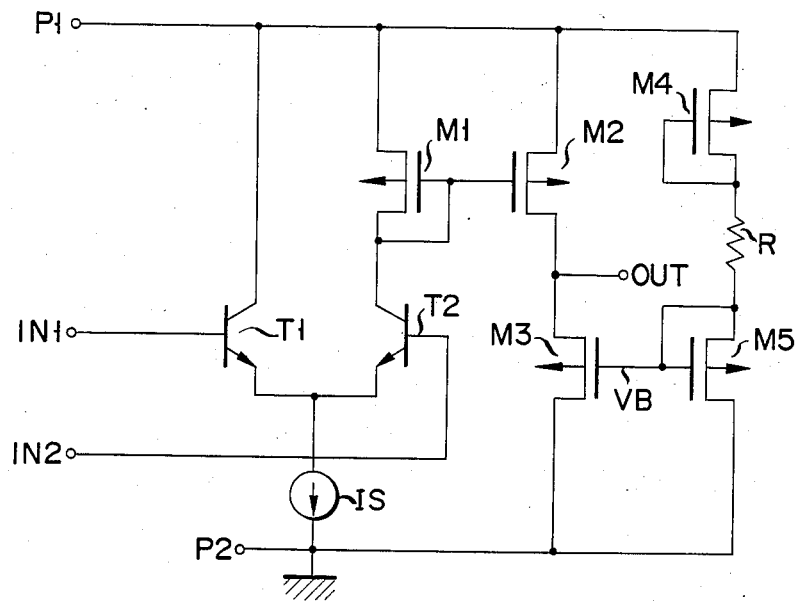
FIG. 4 is a circuit diagram of a voltage level converting circuit according to an embodiment of this invention.

An embodiment of a voltage level converting circuit according to the present invention will be described refering to FIGS. 4 and 5.

In this level converting circuit, a pair of npn transistors T1 and T2 are used as a differential pair. The bases of the npn transistors T1 and T2 are connected, respectively, to input terminals IN1 and IN2, which are coupled for reception with an input signal and an inverted input signal. These transistors are also interconnected at the emitters. The power source potential terminal P1 is directly connected to the collector of the transistor T1. The same is also connected to the collector of the transistor T2, through a current path of the p-channel MOS tranisstor M1. A constant current source IS is connected between a ground potential terminal P2 and a junction between the emitters of transistors T1 and T2. The gate of a MOS transistor M1 is connected to its drain. An output terminal OUT is connected to the power source potential terminal P1 through the current path of a p-channel MOS transistor M2. The terminal OUT connected to the ground potential terminal P2 via the current path of an n-channel MOS transistor M3. The gate of the MOS transistor M2 is connected to the collector of the npn transistor T2. The gate of the MOS transistor M3 is coupled for reception with a bias voltage from a bias circuit. The bias circuit is comprised of, for example, a p-channel MOS transistor M4, n-channel MOS transistor M5, and a resistor R. The resisor R is connected at one end to the potential terminal P1 through the current path of the MOS transistor M4 and, at the other end, to the potential terminal P2 through the current path of the MOS transistor M5. The gate of the MOS transistor M4 is connected to the drain of the transistor itself. The source of the MOS transistor M5 is connected to its gate and to the gate of the MOS transistor M3. The bias voltage is so set as to provide a predetermined value of the current flowing through the transistor M3; smaller than that flowing through the transistor M2.

In operation, the transistors T1 and T2 are turned on or off by the voltage difference between the input and inverted input signals applied to the respective input terminals. For example, when high and low voltages are applied to the input terminals IN1 and IN2, the transistor T1 is turned on and the transistor T2 is turned off. In response to turning off the transistor T2, the MOS transistors M1 and M2 are rendered nonconductive. At this time, the drain capacitance and the load capacitance of the MOS transistor M2 are discharged through the MOS transistor M3 to the ground potential terminal P2. As a result, the potential at the output terminal OUT is reduced to a low (i.e., ground) level.

When the low and high level voltages are applied to the input terminals IN1 and IN2, respectively, the transistor T1 is turned off and transistor T2 is turned on. Upon turning on the transistor T2, the MOS transistors M2 and M3 are rendered conductive. At this time, a load current, larger than that of the transistor T3, flows through the MOS transistor M2 to set the potential at the output terminal OUT at a high level.

Figure 5:
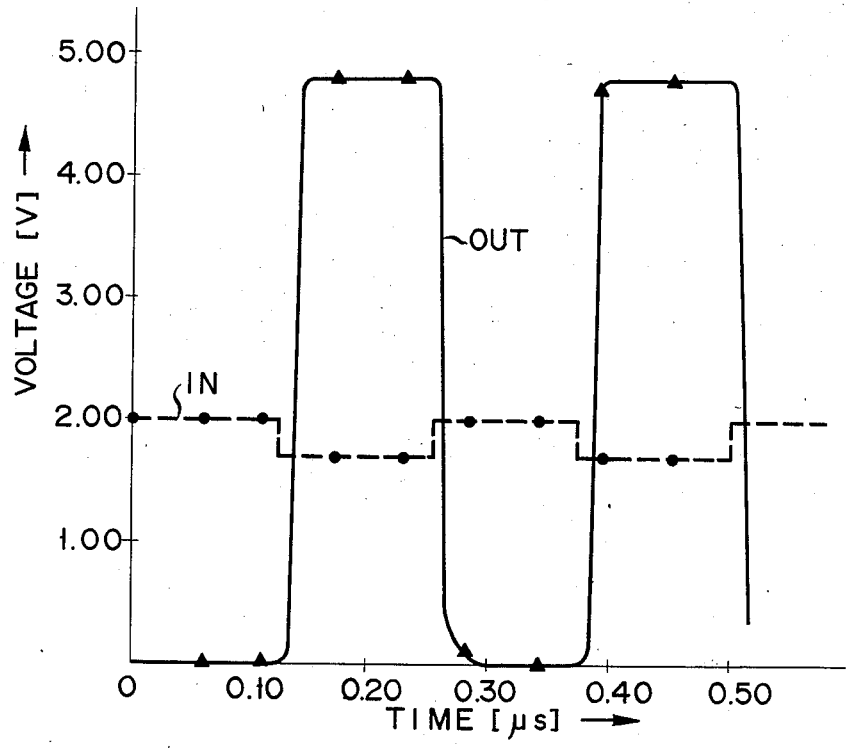
FIG. 5 is a graph illustrating a response characteristic of the level converting circuit of FIG. 4.

FIG. 5 shows a response characteristic of the voltage level converting circuit of this embodiment as plotted by the SPICE simulation. This simulation was conducted with 50 μA of the output current of the constant current source IS. With this converting circuit, if the input signal is varied in a range from 1.7 V to 2.0 V, within which output voltage of the ECL device is generally varied, the output voltage of this circuit varies in a range from 0.0 to 4.8 V, which is the appropriate input voltage range of the TTL device. The level converting circuit produces the output voltage of 0.0 V for the input voltage of 1.7 V, and produces 4.8 V for 2.0 V. As seen from FIG. 5, this converting circuit responds to a change in the input voltage with an extremely short delay time of approximately 10 nS before changing its output voltage.

If the bias voltage is set to approximately 1.3 V, a current of about 100 μA flows into the MOS transistor M3 when the MOS transistor M2 is conductive. Under this condition, the converting circuit can operate at high speed with relatively little power dissipation and under little influence from the load.

It is noted that the bipolar transistors are used in the input stage to receive a small amplitude voltage from the ECL device, and that the MOS transistors are used in the output stage to output an output voltage corresponding to the input voltage. The bipolar differential pair of this input stage can effectively sense the small amplitude input voltage. The MOS transistors of the output stage can quickly respond to the output signal from the input stage, and are not saturated in operation. Therefore, these transistors can control a large amplitude voltage. Thus, the voltage level converting circuit does not require a large number of circuit elements to obtain high speed operation.

In this converting circuit, only a small current flows into the MOS transistor M3 when MOS transistor M2 is turned on. Furthermore, immediately after the MOS transistor M2 is turned off, the discharge current flows into the MOS transistor M3 for a very short period. Except for this discharge current, no current flows through the MOS transistor M3 when the MOS transistor M3 is nonconductive. This fact indicates that the power dissipation of this converting circuit can be satisfactorily reduced.

What is claimed is:

1. A voltage level converting circuit for an input interface to a TTL circuit, comprising:

first and second potential terminals between which a power source voltage is applied;

first and second input terminals coupled for respectively receiving an input signal and an inverted input signal from an ECL circuit;

a differential amplifier for detecting a voltage difference between said input and said inverted input signals, including:

first and second bipolar transistors each having a base, collector, and emitter, with the bases respectively connected to the first and second input terminals, and with the collector of the first bipolar transistor connected only to the first potential terminal, a first constant current source connected to the emitters of the first and second bipolar transistors and connected to the second potential terminal, a first MOS transistor, with a source connected to the first potential terminal, and with the collector of the second bipolar transistor connected to a drain and a gate of the MOS transistor, for providing a current path from the first potential terminal to the collector of the second bipolar transistor at times when the second bipolar transistor is turned on, wherein the first and second bipolar transistors are respectively turned on and off at times when the input signal is at a high voltage, and the first and second bipolar transistors are respectively turned off and on at times when the input signal is at a low voltage; and an output circuit for generating an output logic voltage in accordance with the detected voltage difference, including:

a second MOS transistor, with a source connected to the first potential terminal, with the collector of the second bipolar transistor connected only to a gate of the second MOS transistor and to the drain and gate of the first MOS transistor, and a drain, a second constant current source connected to the drain of the second MOS transistor and to the second potential terminal, and an output terminal at which the output logic voltage is generated connected to the drain of the second MOS transistor, wherein a current path is provided from the first potential terminal to the output terminal and generates the output logic voltage at a high level at times when the second bipolar transistor is turned on, and a current path is not provided from the first potential terminal and generates the output logic voltage at a low level at times when the second bipolar transistor is turned off.

2. A voltage level converting circuit according to claim 1, wherein said second constant current source includes a third MOS transistor of a conductivity type opposite to said second MOS transistor.

3. A voltage level converting circuit according to claim 2, wherein the third MOS transistor has a current path connected between the drain of said second MOS transistor and the second potential terminal, and has a gate supplied with a predetermined bias voltage required to keep the amount of current flowing through the third MOS transistor smaller than that flowing through the second MOS transistor.

4. A voltage level converting circuit according to claim 2, wherein the first and second bipolar transistors are of an npn type, and the first MOS transistor is of a p-channel type.

5. A voltage level converting circuit according to claim 4, wherein the second and third MOS transistors are of the p-channel and n-channel types, respectively.

* * * * *

UNITED STATES PATENT AND TRADEMARK OFFICE
CERTIFICATE OF CORRECTION

PATENT NO. : 4,695,750

DATED : September 22, 1987

INVENTOR(S) : Hiroyuki Hara et al

It is certified that error appears in the above-identified patent and that said Letters Patent is hereby corrected as shown below:

On the title page assignee should read

-- (73) Assignee: Kabushiki Kaisha Toshiba, Kawasaki-Shi, Japan --.

Signed and Sealed this

Second Day of August, 1988

Attest:

DONALD J. QUIGG

*Attesting Officer*

*Commissioner of Patents and Trademarks*